United States Patent
Hsieh et al.

(10) Patent No.: US 10,854,433 B2
(45) Date of Patent: Dec. 1, 2020

(54) IN-SITU REAL-TIME PLASMA CHAMBER CONDITION MONITORING

(71) Applicant: Applied Materials, Inc., Santa Clara, CA (US)

(72) Inventors: Tzu-Yen Hsieh, Hsinchu (TW); Sidda Reddy Kurakula, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/355,138

(22) Filed: Mar. 15, 2019

(65) Prior Publication Data

US 2020/0176233 A1  Jun. 4, 2020

(51) Int. Cl.
| | | |
|---|---|---|
| H01J 37/32 | (2006.01) | |
| H01L 21/67 | (2006.01) | |
| H01L 21/66 | (2006.01) | |
| H01L 21/3065 | (2006.01) | |

(52) U.S. Cl.
CPC .. H01J 37/32972 (2013.01); H01J 37/32862 (2013.01); H01J 37/32981 (2013.01); H01L 21/3065 (2013.01); H01L 21/67069 (2013.01); H01L 21/67253 (2013.01); H01L 22/26 (2013.01); H01J 37/321 (2013.01); H01J 2237/2441 (2013.01); H01J 2237/24507 (2013.01); H01J 2237/334 (2013.01)

(58) Field of Classification Search
CPC ........... H01J 37/32972; H01J 37/32981; H01J 37/32862; H01J 2237/24507; H01J 37/321; H01J 2237/334; H01J 2237/2441; H01J 37/32853; H01J 37/3288; H01J 37/32935; H01L 21/67253; H01L 22/26; H01L 21/67069; H01L 21/3065
USPC ... 438/9, 700, 706, 710, 712, 714, 719, 720; 216/59, 60
See application file for complete search history.

(56) References Cited

U.S. PATENT DOCUMENTS

| | | | |
|---|---|---|---|
| 6,534,007 B1 * | 3/2003 | Blonigan | C23C 14/564 422/62 |
| 7,067,432 B2 | 6/2006 | Xu et al. | |
| 2010/0055807 A1 * | 3/2010 | Srivastava | G03F 7/427 438/9 |
| 2010/0184299 A1 * | 7/2010 | Takahashi | H01L 21/31138 438/710 |
| 2014/0014516 A1 * | 1/2014 | Kumagai | C02F 1/4608 204/556 |
| 2018/0130669 A1 * | 5/2018 | Lane | H01L 21/02321 |

* cited by examiner

*Primary Examiner* — Lan Vinh
(74) *Attorney, Agent, or Firm* — Patterson + Sheridan, LLP

(57) ABSTRACT

Methods for in-situ and real-time chamber condition monitoring is provided. For example, in one embodiment, for each wafer in a chamber, a frequency and wavelength of the free radicals in the chamber is monitored in-situ. The frequency and wavelength of the free radicals are associated with at least one selected chemical. The associated free radicals are compared to an index. The index includes a target range for each chemical in the at least one selected chemical.

20 Claims, 4 Drawing Sheets

IN-SITU REAL-TIME PLASMA CHAMBER CONDITION MONITORING

CROSS REFERENCE TO RELATED APPLICATIONS

This application claims benefit under 35 U.S.C. § 119(b) of Indian Provisional Patent Application No. 201841045267, filed on Nov. 30, 2018 and is incorporated herein by reference in its entirety.

BACKGROUND

Field of the Disclosure

Embodiments of the present disclosure generally relate to semiconductor processing technology and more specifically to methods of in-situ process monitoring.

Description of the Related Art

Semiconductor fabrication includes a series of processes that produce electrical circuits in a semiconductor, e.g., a silicon wafer, in accordance with a circuit design. These processes are carried out in a series of chambers. Successful operation of a modern semiconductor fabrication facility requires a steady stream of wafers to be moved from one chamber to another in the course of forming electrical circuits in the wafer. Such processes inevitably generate different kinds of etch by-products. Some of the by-products deposit onto interior surfaces of the chamber in which the plasma etching process is performed.

The continuing build-up of by-products on interior surfaces, such as the chamber wall, presents two challenges to semiconductor fabrication. First, the structure of the accumulated by-products is not stable. Thus, by-products tend to peel off the chamber wall generating particles and flakes that can fall upon the wafer surface, causing product defects, such as a short circuit between two conductive lines or a discontinuity where the upper layer cannot cover the debris. Second, the by-products remaining on the chamber wall react with the plasma and deleteriously affect the etch performance, a phenomenon that is also referred to as "process drift."

To mitigate the impact of etch by-products, chamber cleaning is required to periodically remove the deposition from the chamber wall. To do this, the chamber is taken out of production and a cleaning plasma is introduced into the chamber. This plasma reacts with the deposition and the products of this reaction are pumped out of the chamber. After such chamber cleaning, however, it has been observed that a clean chamber wall makes the chamber unsuitable for immediate production wafer etching.

When the chamber is opened moisture is introduced from the environment into the chamber. Moisture is a contaminant that can affect the performance of the chamber. Chamber seasoning is a procedure of etching a series of blank silicon wafers to restore a chamber wall condition that is suitable for production wafer etching. After chamber seasoning, a thin layer of silicon oxide covers the chamber wall. After chamber seasoning, the chamber goes through a qualification cycle where qualification wafers are produced and examined to determine whether the chamber is ready for a return to the production cycle. If the qualification wafers comply with specification, the chamber is then returned to production wafer etching. If the qualification wafers do not comply with specifications then more wafers are run to further season the chamber and thereafter more qualification wafers are run and examined.

Chamber seasoning time and wafer qualification time are very time consuming. If the qualification wafers do not comply with specification the first time then even more time is expended re-seasoning the chamber and testing of more wafers for qualification thus increasing the time that the chamber is down.

Therefore, it is highly desirable to develop a method of process monitoring and chamber seasoning that does not rely on measuring the etch rate and thereby avoids interruptions to production or seasoning. It is also preferred that such method monitors the chamber wall condition in a manner so as to provide real-time, accurate information about process drift and chamber seasoning.

SUMMARY

Embodiments herein generally relate to semiconductor processing technology and more specifically to a method of in-situ process monitoring. Some embodiments herein generally relate to methods for in-situ and real-time chamber condition monitoring is provided. For example, in one embodiment, for each wafer in a chamber, a frequency and wavelength of the free radicals in the chamber is monitored in-situ. The frequency and wavelength of the free radicals are associated with at least one selected chemical. The associated free radicals are compared to an index. The index includes a target range for each chemical in the at least one selected chemical.

In another embodiment, at least one wafer is inserted into a chamber. A gas is injected into the chamber. The gas includes a source of free radicals. A frequency and wavelength of the free radicals in the probing gas is monitored. The frequency and wavelength of the free radicals are associated with at least one selected chemical. The associated free radicals are compared to an index. The index includes a target range for each chemical in the at least one selected chemical. The ICC recipe is changed in response to the comparison when the associated free radicals are not within the target range.

In yet another embodiment, for each wafer in a chamber, a frequency and wavelength of the free radicals for Fluorine in the chamber are monitored in-situ. The frequency and wavelength of the free radicals indicative of Fluorine are compared to an index. The index includes a target range for Fluorine. The Fluorine level in the chamber when the free radicals indicative of Fluorine approach lower limits of the target range.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the figures.

DETAILED DESCRIPTION

In the following description, numerous specific details are set forth to provide a more thorough understanding of the disclosure. As will be apparent to those skilled in the art, however, various changes using different configurations may be made without departing from the scope of the disclosure. In other instances, well-known features have not been described in order to avoid obscuring the disclosure. Thus, the disclosure is not considered limited to the particular illustrative embodiments shown in the specification and all such alternate embodiments are intended to be included in the scope of the appended claims.

Figure 1:
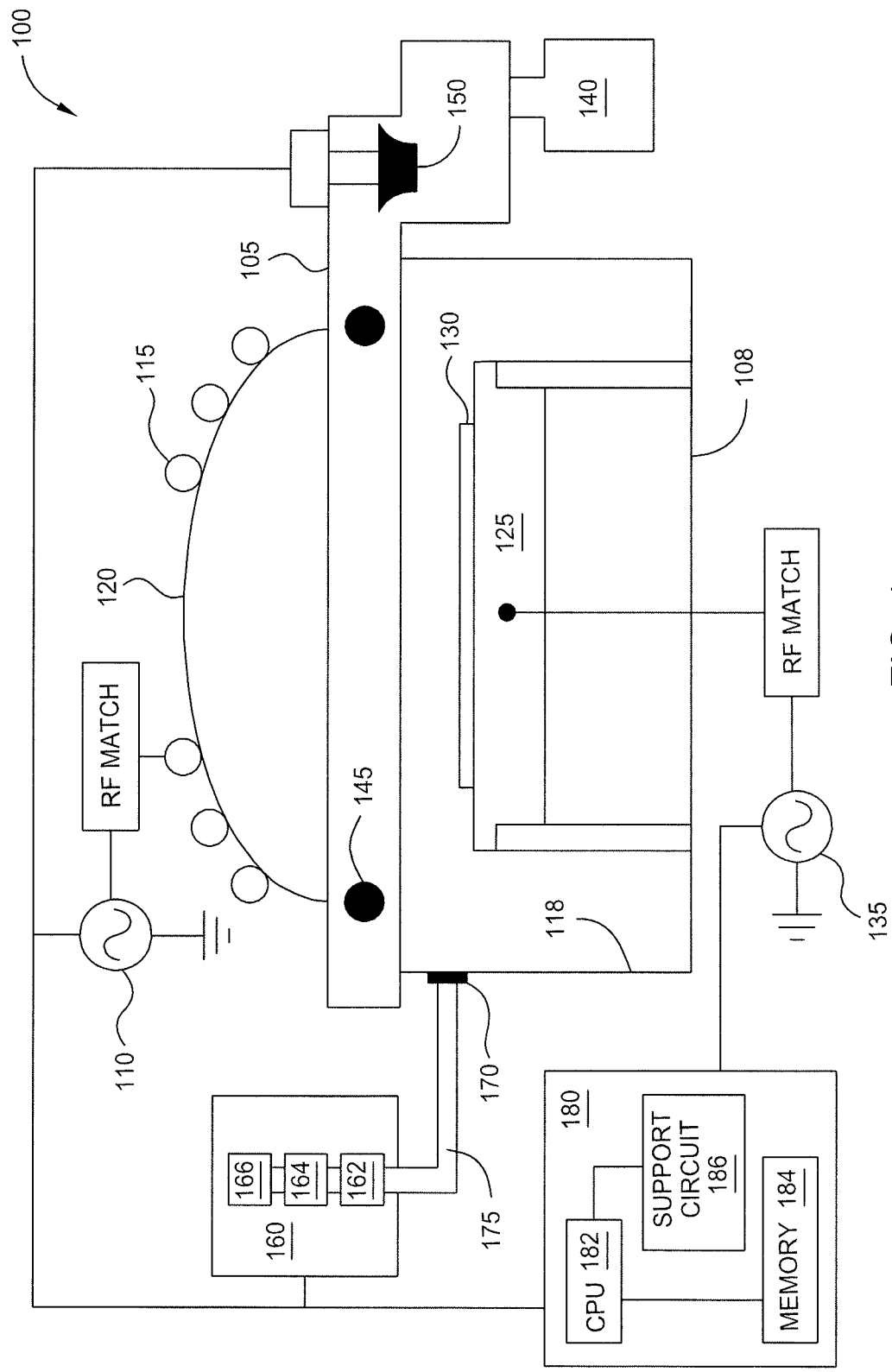
FIG. 1 is a schematic view of an inductively coupled plasma reactor in accordance with embodiments disclosed herein.

FIG. 1 provides a schematic view of such a reactor. Plasma reactor/chamber 100 includes an upper chamber body 105 and a lower chamber body 108. On top of the upper chamber body 105 is a dielectric dome 120. A chamber wall 118 encloses the lower chamber body. The dome material is alumina and the chamber wall 118 is anodized aluminum. The dielectric dome 120 and chamber wall 118 are maintained at a constant temperature (80 degrees Celsius for the dome and 65 degrees Celsius for the chamber wall 118).

A high-density plasma is generated by applying a Radio Frequency (RF) power source 110 of 12.56 MHz to an inductive coil 115 on dielectric dome 120, which is set on top of the upper chamber body 105. A cathode 125 equipped with an electrostatic chuck (not shown) holds a semiconductor wafer 130, which is also thermally controlled during etching using helium backside cooling. A separate RF bias power source 135 of 13.56 MHz is applied to the cathode 125 to control ion bombardment energy to the wafer 130. The chamber 100 is evacuated by a 2000 l/s turbomolecular pump 140 backed by a dry mechanical pump (not shown).

Process gases are introduced through four gas distribution rings 145 on the chamber wall with controlled flow rates. Chamber pressure is maintained at a designated value with a throttle valve 150. An optical spectrometer 160 including a prism 162, a monochromator 164, and a photodiode array (PDA) detector 166, is used to record the optical emission spectrum. The optical signal is collected from a sensor 170 in the chamber and fed through a multi-strand optical fiber 175. The sensor 170 transmits that data to the spectrometer 160. The spectrometer 160 separates the free radicals into chemicals associated with those frequencies and wavelengths. "Chemicals" as used herein are defined broadly as including chemical and chemical compounds. The spectrometer 160 can separate free radical for chemicals (e.g., Fluorine or Oxygen) and/or chemical compounds (e.g., Fluorine Nitrate or Silicon Nitrate). To save processor resources, a customer/end user can select which chemicals are identified.

A control system 180 comprising a CPU 182, a memory 184, and support circuits 186 for the CPU 182 controls the various components of the plasma reactor 100. A software routine or a series of program instructions stored in the memory 184, when executed by the CPU 182, causes the reactor 100 to perform the processes of the material disclosed herein. In various embodiments, memory 184 also includes programs (not shown) for performing the embodiments described herein.

In other embodiments, the memory 184 includes programs (not shown) for identifying chemicals in the chamber 100 based upon free radical wavelength and frequency; provide alerts based upon a relationship between a target range, and the frequency and wavelength of associated free radicals; and increase the Green-2-Green time by in-situ monitoring of the frequency and wavelength of free radicals inside the chamber 100.

The processor 182 cooperates with conventional support circuitry 186 such as power supplies, clock circuits, cache memory and the like as well as circuits that assist in executing the software routines (not shown) stored in the memory 184. As such, it is contemplated that some of the process steps discussed herein as software processes can be loaded from a storage device (e.g., an optical drive, floppy drive, disk drive, etc.) and implemented within the memory 184 and operated by the processor 182. Thus, various steps and methods of the present disclosure can be stored on a computer readable medium.

The chamber 100 periodically needs preventative maintenance ("PM") servicing and is referred to herein as a "PM cycle." The chamber 100 is taken out of production and placed in the PM cycle based upon performance of the tool. The PM cycle can take the form of a "minor PM" cycle or a "major PM" cycle. In a minor PM cycle few parts are changed while in a major PM more parts are changed. To perform a PM, the chamber 100 needs to be opened and exposed to the atmosphere outside of the chamber 100. Replacing more parts in the chamber 100 causes the chamber 100 to be opened longer and increases exposure to moisture (e.g., OH) in the chamber 100. The parts that have been introduced into the chamber 100 also introduce moisture (e.g., OH) into the chamber 100.

Figure 3:
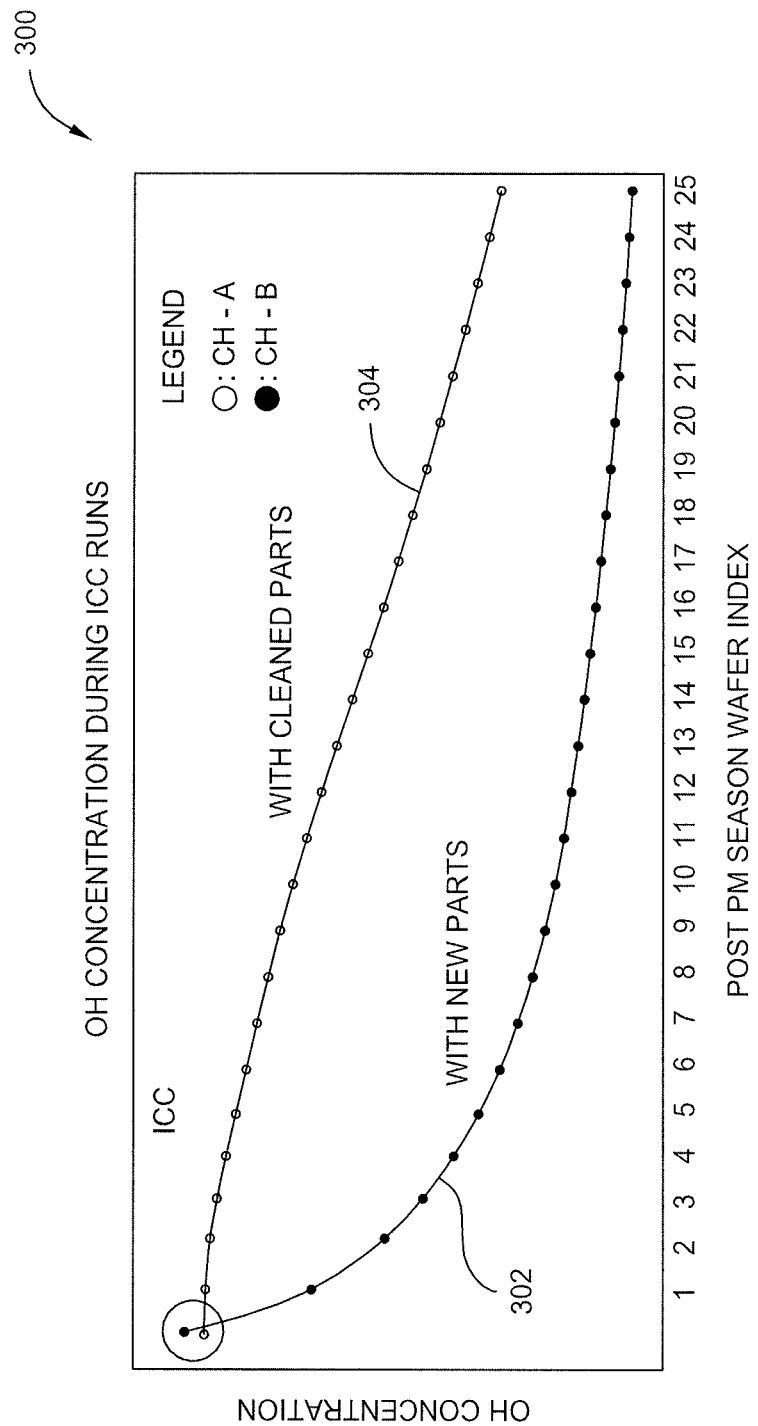
FIG. 3 depicts a plot in accordance with embodiments disclosed herein.

To bring the chamber 100 back into production, the chamber 100 undergoes a seasoning cycle and a qualification cycle. In accordance with embodiments described herein, the wavelengths and frequencies of chemicals can be monitored to reduce the seasoning cycle and the qualification cycle. For illustrative purposes, FIG. 3 depicts a plot of OH and Fluorine levels during the seasoning cycle and qualification cycle.

Figure 2:
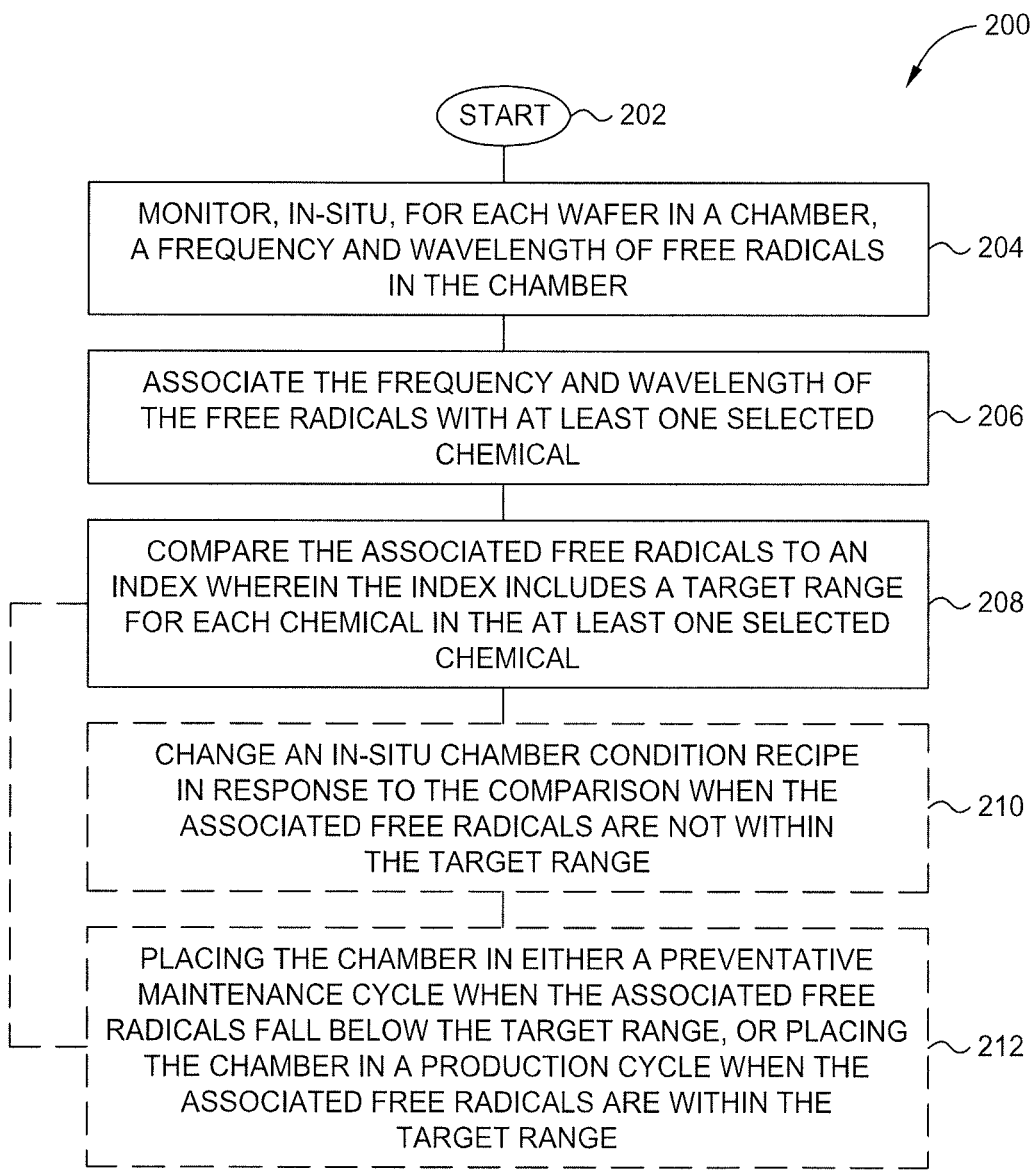
FIG. 2 depicts a method for in-situ process monitoring in accordance with embodiments disclosed herein.

FIG. 2 depicts an example method 200 for in-situ monitoring of the frequency and wavelength of selected gases in the processing chamber 100. For example, during a seasoning cycle, the method 200 begins at block 202 and proceeds towards block 204. At block 204 the sensor 170 monitors, in-situ, the frequencies and wavelengths of free radicals of gas inside the chamber 100.

At block 206, the free radicals are associated with at least one chemical based upon their frequency and wavelength. For example, free radicals having the wavelength and frequency indicative of Chlorine are associated with Chlorine and are separated into a channel for Chlorine. Examples of other gases that can be associated due to their frequency and wavelength are Carbon Nitride, Oxygen, Fluorine, Xenon, Carbon, Argon, Silicon, Silicon Nitride, Hydrogen, and Hydride.

In addition, a first Silicon at one wavelength and frequency can be monitored and classified differently than a second Silicon at a different wavelength and frequency than the first Silicon. In various embodiments, a selection can be made (e.g., by a customer) to monitor one chemical (e.g., Fluorine during a production cycle) or any combination of chemicals (all chemicals typically found in the chamber during the seasoning cycle).

At block 208, the free radicals in each channel (i.e., associated free radicals) are compared to an index (not shown). The index includes a target range for each chemical in the at least one chemical. For example, if one chemical is selected (e.g., Fluorine) then the target range for Fluorine is selected for comparison with the free radicals associated with Fluorine that are identified as being in the chamber 100. A user may select which associated free radicals to monitor. A user may also plot changes in the intensity of associated free radicals. For example during the seasoning cycle, parts are replaced in the chamber 100 and the chamber 100 is then closed. The wavelength and frequency of free radicals indicative of OH may be monitored and compared to the index for OH. During the seasoning cycle, running seasoning wafers reduces the OH level in the chamber 100.

Optionally, the associated free radicals may be plotted. For example, the OH concentration provides a graphical representation of the reduction in OH concentration in the chamber 100. Continually running seasoning wafers while in-situ monitoring of the free radicals associated with OH allows a customer to run wafers to reduce OH until the OH is at a minimal level (i.e., the OH level has stabilized and is no longer declining at a rapid level).

A plot of the decrease in the OH level when new parts are placed in the chamber 100 is different than a plot of the decrease in the OH level with cleaned parts during the course of seasoning twenty-five wafers. FIG. 3 depicts a graph 300 having a plot 302 and a plot 304. Plot 302 shows the decrease in OH concentration after each seasoning wafer when new parts are in the chamber 100. Plot 304 shows the decrease in OH concentration after each seasoning wafer when cleaned parts are in the chamber 100. The steady state (a small change rate or no change) for OH in the chamber 100 is different for new parts than used parts.

When the OH is at an acceptable level or steady state level, the wavelength and frequency of free radicals indicative of Fluorine may be monitored to determine the Fluorine level in the chamber 100 due to parts inside the chamber 100. New parts in the chamber 100 will provide a higher Fluorine level than used parts that have been cleaned. When new parts are used the etch trench rate may be changed so that it is faster because the wafers can be processed. When cleaned parts are used they provide a lower Fluorine level (relative to that provided by new parts) the etch trench rate may be decreased.

When the Fluorine level and OH level are at an acceptable level, the seasoning cycle is finished. After the seasoning cycle is finished, dummy wafers are run for the qualification cycle. Because the OH level has been monitored in-situ and wafers run until the rate of decline in OH is minimal (or there is no OH) the qualification time is significantly reduced. For example, running the qualification cycle after twenty-five wafers have been seasoned will produce a shorter qualification time than running the qualification cycle after ten wafers have been seasoned. In addition, the methods disclosed herein allow seasoning and then qualification without having need to perform the seasoning cycle, performing the qualification cycle and then re-performing the seasoning cycle if the wafers fail the first qualification, and then performing a second qualification cycle. In addition, in-situ monitoring of the associated free radicals provides efficiency when variables such as new parts or cleaned parts are used, whether a minor PM or major PM occurs, or variations when using one chamber versus another chamber.

Returning to FIG. 2, the method 200 also includes optional blocks 210 and 212. At optional block 210, an in-situ chamber condition ("ICC") recipe is changed in response to the comparison, when the associated free radicals are not within the target range. For example, when the associated free radicals are not within the target range, the rate at which chemicals may be added to the chamber are altered and the etch trench may be changed.

At optional block 212, when the associated free radicals are below the target range the chamber 100 may be taken out of the production cycle and placed in preventative maintenance for servicing, seasoning and qualification. When the associated free radicals are within a target range the chamber 100 may be again placed in the production cycle.

Figure 4:
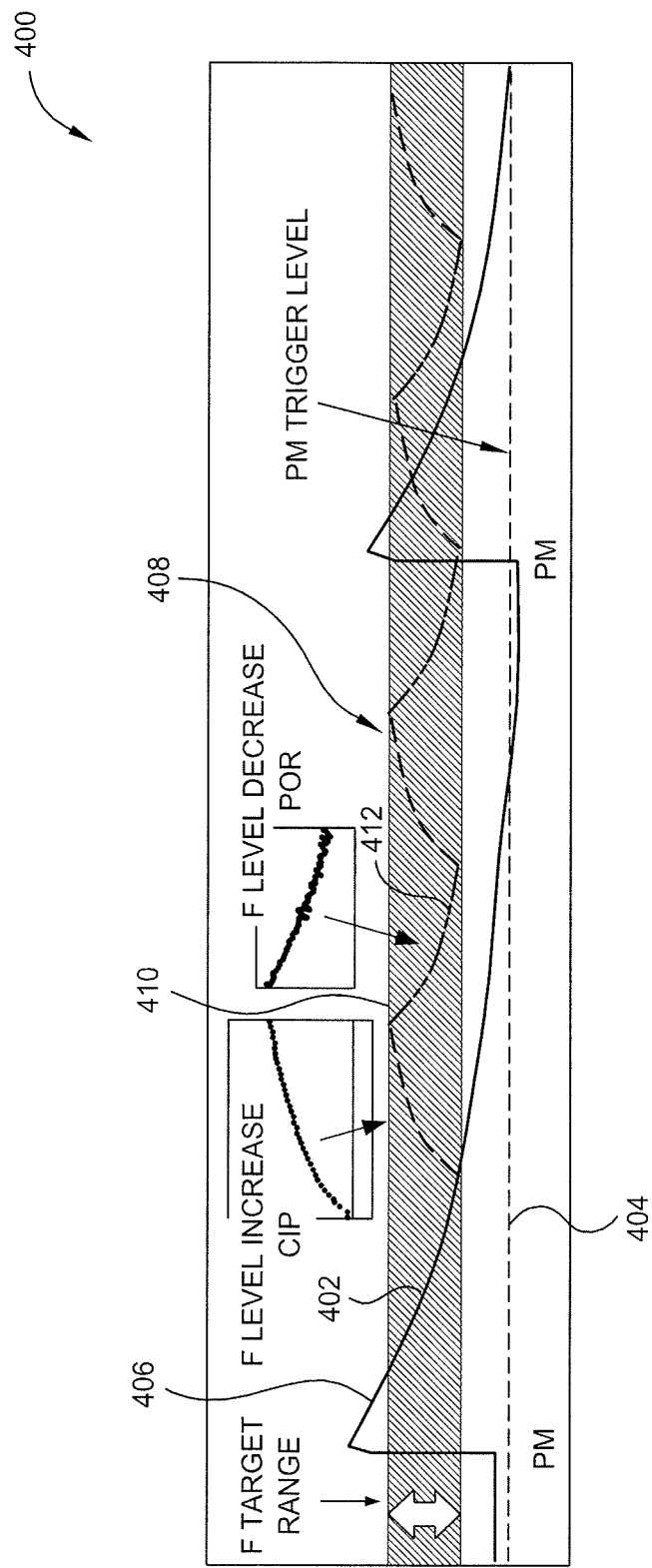
FIG. 4 depicts a plot in accordance with embodiments disclosed herein.

Embodiments disclosed herein may also be used to increase the mean-time-between-cleaning. In addition, in-situ monitoring of the wavelengths and frequencies of free radicals allows for the addition of chemicals as needed. For example, FIG. 4 depicts a pictorial comparison 400 in-situ monitoring and increasing of the Fluorine level in accordance with embodiments disclosed herein against the prior art. The pictorial comparison 400 includes a target range 402 that indicates an acceptable operating range for Fluorine level. An unacceptable level 404 indicates that the chamber 100 needs to be taken out of production and into preventative maintenance if the Fluorine level falls below unacceptable level 404. Wave 406 indicates a decline in the Fluorine level into preventative maintenance and back into production. Wave 408 utilizes the material disclosed herein and includes in-situ monitoring of the wavelength and frequency of free radicals indicative of Fluorine and increasing the Fluorine level when the Fluorine is approaching the lower limits of the target range. The result of the added Fluorine is shown at wave portion 410. Over time, the Fluorine level begins to drop and is shown at wave portion 412. When the Fluorine level again approaches the lower limits of the target range, Fluorine can again be added to the chamber 100. By in-situ monitoring and repetitively adding Fluorine into the chamber the mean-time-between-cleaning can be increased. For example, the mean-time-between-cleaning can be increase well over 600 RF hours without the need of a minor PM or a major PM.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise.

While the foregoing is directed to embodiments of the present disclosure, other and further embodiments of the disclosure may be devised without departing from the basic scope thereof, and the scope thereof is determined by the claims that follow.

We claim:

1. A method, comprising:
monitoring, in-situ, for each wafer in a chamber, a frequency and wavelength of free radicals in the chamber;
associating the frequency and wavelength of the free radicals with at least one selected chemical; and
comparing the associated free radicals to an index wherein the index includes a target range for each chemical in the at least one selected chemical.

2. The method of claim 1, further comprising:
changing an in-situ chamber condition recipe in response to the comparison when the associated free radicals are not within the target range.

3. The method of claim 1, further comprising:
placing the chamber in one of:
a preventative maintenance cycle when the associated free radicals fall below the target range; and
placing the chamber in a production cycle when the associated free radicals are within the target range.

4. The method of claim 1, further comprising:
plotting each comparison.

5. The method of claim 1, further comprising:
providing an alert when at least one of:
the associated free radicals are within the target range;
the associated free radicals are below the target range; and
the associated free radicals are above the target range.

6. The method of claim 1, wherein monitoring occurs during one of:
a wafer production cycle; and
a chamber cleaning cycle.

7. The method of claim 6, wherein the chamber cleaning cycle comprises:
a chamber seasoning cycle; and
a chamber qualification cycle.

8. The method of claim 7, further comprising:
seasoning wafers until hydroxide levels within the chamber are at a steady state; and
performing a qualification cycle.

9. The method of claim 1, wherein the monitoring and the comparison includes at least one of:
monitoring a frequency and wavelength of the free radicals associated with a hydroxide in the chamber and comparing associated hydroxide free radicals to an index for hydroxide; and
monitoring a frequency and wavelength of the free radicals associated with fluorine in the chamber and comparing associated fluorine free radicals to an index for fluorine.

10. The method of claim 1, wherein the monitoring and the comparison includes at least one of:
monitoring a frequency and wavelength of the free radicals associated with a hydroxide in the chamber and comparing associated hydroxide free radicals to an index for hydroxide;
monitoring a frequency and wavelength of the free radicals associated with fluorine in the chamber and comparing associated fluorine free radicals to an index for fluorine;
monitoring a frequency and wavelength of the free radicals associated with hydrogen in the chamber and comparing associated hydrogen free radicals to an index for hydrogen;
monitoring a frequency and wavelength of the free radicals associated with chlorine in the chamber and comparing associated chlorine free radicals to an index for chlorine;
monitoring a frequency and wavelength of the free radicals associated with oxygen in the chamber and comparing associated oxygen free radicals to an index for oxygen;
monitoring a frequency and wavelength of the free radicals associated with argon in the chamber and comparing associated argon free radicals to an index for argon;
monitoring a frequency and wavelength of the free radicals associated with xenon in the chamber and comparing associated xenon free radicals to an index for xenon;
monitoring a frequency and wavelength of the free radicals associated with silicon in the chamber and comparing associated silicon free radicals to an index for silicon;
monitoring a frequency and wavelength of the free radicals associated with silicon nitride and comparing associated silicon nitride free radicals to an index for silicon nitride; and
monitoring a frequency and wavelength of the free radicals associated with carbon in the chamber and comparing associated carbon free radicals to an index for carbon.

11. The method of claim 1, further comprising:
inserting a plurality of wafers into the plasma chamber.

12. A method for in-situ and real-time chamber condition monitoring, comprising:
inserting at least one wafer into a plasma chamber;
injecting a gas into a plasma chamber wherein the gas comprises a source of free radicals;
monitoring a frequency and wavelength of the free radicals in the gas;
associating the frequency and wavelength of the free radicals with at least one selected chemical; and
comparing the associated free radicals to an index wherein the index includes a target range for each chemical in the at least one selected chemical.

13. The method of claim 12, further comprising:
changing an in-situ chamber condition ("ICC") recipe in response to the comparison.

14. The method of claim 12, wherein the monitoring and the comparison includes at least one of:
monitoring a frequency and wavelength of the free radicals associated with a hydroxide in the chamber and comparing associated hydroxide free radicals to an index for hydroxide; and
monitoring a frequency and wavelength of the free radicals associated with fluorine in the chamber and comparing associated fluorine free radicals to an index for fluorine.

15. The method of claim 12, further comprising:
providing an alert when at least one of:
the associated free radicals are within the target range;
the associated free radicals are below the target range; and
the associated free radicals are above the target range.

16. The method of claim 12, wherein the monitoring and the comparison includes at least one of:
monitoring a frequency and wavelength of the free radicals associated with a hydroxide in the chamber and comparing associated hydroxide free radicals to an index for hydroxide;
monitoring a frequency and wavelength of the free radicals associated with fluorine in the chamber and comparing associated fluorine free radicals to an index for fluorine;
monitoring a frequency and wavelength of the free radicals associated with hydrogen in the chamber and comparing associated hydrogen free radicals to an index for hydrogen;
monitoring a frequency and wavelength of the free radicals associated with chlorine in the chamber and comparing associated chlorine free radicals to an index for chlorine;
monitoring a frequency and wavelength of the free radicals associated with oxygen in the chamber and comparing associated oxygen free radicals to an index for oxygen;

monitoring a frequency and wavelength of the free radicals associated with argon in the chamber and comparing associated argon free radicals to an index for argon;

monitoring a frequency and wavelength of the free radicals associated with xenon in the chamber and comparing associated xenon free radicals to an index for xenon;

monitoring a frequency and wavelength of the free radicals associated with silicon in the chamber and comparing associated silicon free radicals to an index for silicon;

monitoring a frequency and wavelength of the free radicals associated with silicon nitride and comparing associated silicon nitride free radicals to an index for silicon nitride; and monitoring a frequency and wavelength of the free radicals associated with carbon in the chamber and comparing associated carbon free radicals to an index for carbon.

17. A method, comprising:

monitoring, in-situ, for each wafer in a chamber, a frequency and wavelength of free radicals of gases in the chamber;

associating the frequency and wavelength of the free radicals with a chemical; and comparing the associated free radicals to an index wherein the index includes a target range for each chemical; and changing a gas recipe in the chamber in response to the comparison.

18. The method of claim 17, wherein the monitoring and the comparison includes at least one of:

monitoring a frequency and wavelength of the free radicals associated with a hydroxide in the chamber and comparing associated hydroxide free radicals to an index for hydroxide;

monitoring a frequency and wavelength of the free radicals associated with fluorine in the chamber and comparing associated fluorine free radicals to an index for fluorine;

monitoring a frequency and wavelength of the free radicals associated with hydrogen in the chamber and comparing associated hydrogen free radicals to an index for hydrogen;

monitoring a frequency and wavelength of the free radicals associated with chlorine in the chamber and comparing associated chlorine free radicals to an index for chlorine;

monitoring a frequency and wavelength of the free radicals associated with oxygen in the chamber and comparing associated oxygen free radicals to an index for oxygen;

monitoring a frequency and wavelength of the free radicals associated with argon in the chamber and comparing associated argon free radicals to an index for argon;

monitoring a frequency and wavelength of the free radicals associated with xenon in the chamber and comparing associated xenon free radicals to an index for xenon;

monitoring a frequency and wavelength of the free radicals associated with silicon in the chamber and comparing associated silicon free radicals to an index for silicon;

monitoring a frequency and wavelength of the free radicals associated with silicon nitride and comparing associated silicon nitride free radicals to an index for silicon nitride; and monitoring a frequency and wavelength of the free radicals associated with carbon in the chamber and comparing associated carbon free radicals to an index for carbon.

19. The method of claim 17, wherein the gas is fluorine and the gas recipe includes increasing the fluorine level in the chamber when the associated free radicals for fluorine approach a predetermined target range.

20. The method of claim 17, further comprising:

providing an alert when at least one of:

the associated free radicals are within a predetermined value in the target range;

the associated free radicals are below the predetermined value in the target range; and the associated free radicals are above the predetermined value in the target range.

* * * * *